United States Patent [19]

Magee

[11] 3,912,539

[45] Oct. 14, 1975

[54] SOLAR CELLS

[75] Inventor: Vincent Magee, Stockport, England

[73] Assignee: Ferranti, Limited, Hollinwood, England

[22] Filed: Feb. 2, 1973

[21] Appl. No.: 329,075

[30] Foreign Application Priority Data

Feb. 3, 1972 United Kingdom................ 5110/72

[52] U.S. Cl. ...................................... 136/89; 357/55

[51] Int. Cl.² ........................................ H01L 31/00

[58] Field of Search ........... 317/235 (27), 239 (47); 136/89; 357/55

[56] References Cited

UNITED STATES PATENTS

| | | | |
|---|---|---|---|
| 2,629,800 | 2/1953 | Pearson | 357/55 X |
| 3,411,952 | 11/1968 | Ron et al. | 136/89 |
| 3,427,459 | 2/1969 | Truffert | 136/89 X |
| 3,672,999 | 6/1972 | Barbera | 136/89 |
| 3,768,037 | 10/1973 | Migitaka et al. | 317/235 N |

FOREIGN PATENTS OR APPLICATIONS

| | | | |
|---|---|---|---|
| 680,977 | 5/1963 | Italy | 136/89 |

*Primary Examiner*—Patrick P. Garvin
*Assistant Examiner*—John F. Niebling
*Attorney, Agent, or Firm*—Cameron, Kerkam, Sutton, Stowell & Stowell

[57] ABSTRACT

An array of solar cells comprises a plurality of semiconductor devices, each semiconductor device comprising a solar cell and a protective diode, most solar cells being connected individually in parallel with a protective diode in a different semiconductor device, to provide a compact arrangement for the array, within each semiconductor device the radiation-sensitive P-N junction of the solar cell being isolated from the P-N junction of the protective diode.

13 Claims, 3 Drawing Figures

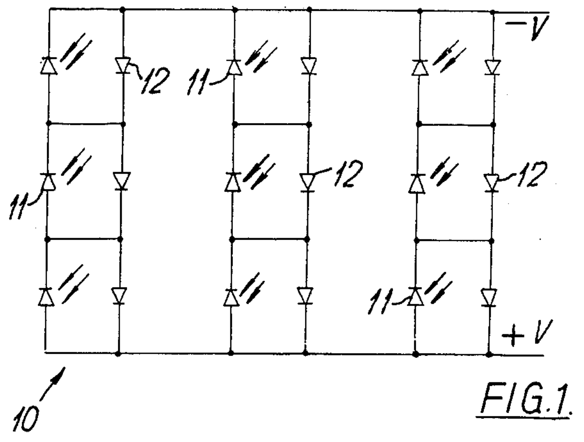
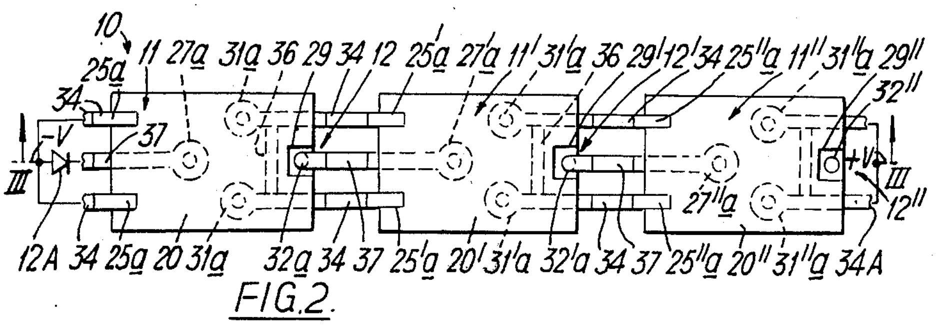
FIG. 2.
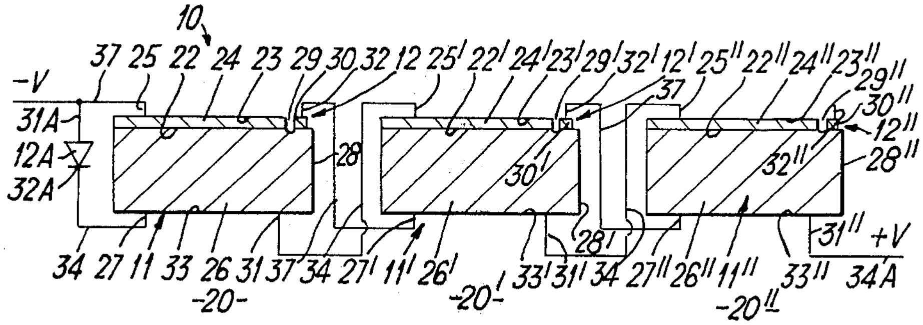
FIG. 3.

SOLAR CELLS

This invention relates to solar cells to be arranged in arrays and to convert radiant energy into electrical energy, each solar cell comprising a radiation-sensitive P-N junction in a semiconductor body.

In a regular, rectangular array, in order to obtain a desired output voltage from the array, a requisite number of cells are connected in series in each linearly-extending part of the array comprising a column or row of the array. If the cells in each column are connected in series, the desired output current of the array is obtained by connecting the requisite number of columns in parallel. Alternatively, the cells of each row are in series, and the rows are connected in parallel with each other. If a cell of an array is rendered inoperable because of damage, or because it is obscured and cannot receive the radiation to which it is sensitive, the output of all the cells connected in series with the inoperable cell is cut off. It is known, however, to connect a protective diode in parallel with each solar cell in an array, the P-N junction of the protective diode and the radiation-sensitive P-N junction of the solar cell being arranged with reverse polarity to each other. In such an arrangement if a solar cell is rendered inoperable the current from the remainder of the cells in series with the inoperable cell is still supplied to the output of the array.

The provision of the protective diodes is desirable when the array is to be employed in an application where it is important that the magnitude of the output current of the array is not inadvertantly reduced significantly, for example, when the array is required to provide the electrical supply of a space satellite. In such an application it is also important to arrange that the total of the radiation-sensitive areas of the P-N junctions of the solar cells of the array is as large as possible, and commensurate with the volume occupied by the array bring small as possible.

It is an object of the present invention to provide means for forming an array of solar cells of a compact construction, in at least part of the array each solar cell being arranged with reverse polarity of the P-N junction of a protective diode, and the total of the radiation-sensitive areas of the P-N junctions of the solar cells of the completed array comprising all but an insignificant proportion of the overall area of the array to be exposed to radiation.

According to the present invention a semiconductor device for an array of solar cells comprises in a semiconductor body a combination of a solar cell and a protective diode, within the semiconductor body the radiation-sensitive P-N junction of the solar cell being isolated from the P-N junction of the protective diode.

In the array at least the majority of the solar cells are connected individually in parallel with a protective diode in a different semiconductor device from the solar cell, and the radiation-sensitive P-N junction of the solar cell is arranged with reverse polarity to the P-N junction of the protective diode with which it is to be connected parallel.

According to another aspect the present invention comprises a method of manufacturing a semiconductor device for an array of solar cells, the method comprising a semiconductor body and forming in the semiconductor body a semiconductor device comprising a combination of a solar cell and a protective diode, within the semiconductor body the radiation-sensitive P-N junction of the solar cell being isolated from the P-N junction of the protective diode.

According to yet another aspect the present invention comprises an array of solar cells having at least one part including a plurality of semiconductor devices, each semiconductor device comprising a solar cell and a protective diode, with the radiation-sensitive P-N junction of the solar cell being isolated from the P-N junction of the protective diode, in each said part of the array the plurality of semiconductor devices being interconnected to form a corresponding plurality of solar cells in series, and each of the solar cells except one being connected individually in parallel with a protective diode in a different semiconductor device from the solar cell, the radiation-sensitive P-N junction of a solar cell being arranged with reverse polarity to the P-N junction of a protective diode with which it is connected in parallel.

The present invention will now be described by way of example with reference to the accompanying drawings, in which FIG. 1 is a circuit diagram of a 3 × 3 matrix of diode-protected solar cells comprising an array of a known kind, FIG. 2 is a plan view of a column of one embodiment of the array according to the present invention, and FIG. 3 is a section on the line III — III of FIG. 2.

An array 10 of solar cells 11 is represented in the circuit diagram of FIG. 1, and comprises a 3 × 3 matrix of cells, each column of the array comprising three cells 11 connected in series, the columns being connected in parallel with each other, and the output of the array being provided between two rails −V and +V. The voltage of the output of the array 10 is 3 times the voltage generated across each cell 11, and the current of the output of the array 10 is 3 times the current produced by the cells 11 of each column of the array. Each solar cell 11 is connected in parallel with a protective diode 12, and the radiation-sensitive P-N junction of the cell 11 is arranged with reverse polarity to the P-N junction of the protective diode 12. Thus, if a cell is rendered inoperable, either by being damaged, or by being obscured to the radiation to which it is sensitive, the output of array is not significantly affected.

One embodiment of the array 10 according to the present invention is shown partially in FIGS. 2 and 3, the illustrated part comprising a column of the array. In this part of the array there are three monolithic semiconductor devices 20, each semiconductor device comprising a solar cell 11 and a protective diode 12. The semiconductor device 20 is formed in a semiconductor body which is rectangular in plan. As shown in FIG. 3, the body has a planar, radiation-sensitive P-N junction 22 extending parallel to the whole of the upper surface 23, of the body, through which upper surface 23 the P-N junction is to be exposed to radiation. The P-N junction is formed by diffusion in a known manner. The bulk 24 of the upper, N-type region of the body is connected to the cathode 25 for the solar cell, and has a smaller thickness than the lower, P-type region 26 of the body which is connected to the anode 27 of the solar cell. The whole of the P-N junction 22, except for a small portion adjacent to one of the shorter sides 28 of the periphery of the body, comprises the solar cell. The small portion of the junction 22 comprises the protective diode 12, and is provided adjacent to the midpoint of the side 28 by etching a slot 29 around a small portion 30 of the upper, N-type region, the slot 29 extending through the N-type region and intersecting the P-N junction 22.

The lower P-type region 26 of the solar cell 11 is integral with the P-type region of the protective diode 12. The anode 31 of the protective diode is connected to the P-type region 26, and the cathode 32 of the protective diode is connected to the small portion 30 of the N-type region. The small portion 30 of the N-type region is electrically isolated from the bulk 24 of the N type region by the slot 29 around the small portion 30. The anodes 27 and 31, and the cathodes 25 and 32, of both the solar cell and the protective diode, comprise contacts provided in known manner on the semiconductor device 20, the anodes 27 and 31 being provided on the lower surface 33 and the cathodes 25 and 32 being provided on the upper surface 23 of the semiconductor device.

Three semiconductor devices 20, 20' and 20'' and a separate protective diode 12A comprise a column of the array 10. The anode 31A of the separate protective diode 12A is connected to the −V rail, the cathode 32A of the separate protective diode 12A is connected to the anode 27 of the solar cell 11 of the first semiconductor device 20. The −V rail is connected to the cathode 25 of the solar cell 11 of the first semiconductor device 20. Thus, the solar cell 11 of the first semiconductor device 20 and the separate protective diode 12A are connected in parallel with each other, the radiation-sensitive P-N junction of the solar cell being arranged with reverse polarity to the P-N junction of the protective diode, in the required manner for a solar cell and a protective diode in the array. The cathode 32 of the protective diode 12 of the first semiconductor device 20 is connected to the anode 27 of the solar cell 11' of the second semiconductor device 20', and the anode 31 of the protective diode 12 of the first semiconductor device 20 is connected to the cathode 25' of the solar cell 11' of the second semiconductor device 20'. In this way a second solar cell 11' and protective diode 12 are arranged in the required manner in the array. A third solar cell 11'' and protective diode 12' are arranged in the required manner in the array by connecting them together in the same way as the second solar cell 11' and protective diode 12, the third solar cell 11'' being part of the third semiconductor device 20'' and the third protective diode 12' being part of the second semiconductor device 20'. The anode 27'' of the solar cell 11'' of the third semiconductor device 20'' is also connected, via the anode 31 of the protective diode 12'' of the third semiconductor device 20'' to the +V rail. The cathode 32'' of the protective diode 12'' of the third semiconductor device is left floating.

The provision of each column of the array 10 by the requisite number of semiconductor devices 20, together with a single, separate protective diode 12A, ensures that the array is capable of having a compact form, with the total of the radiation-sensitive areas of the P-N junction of the solar cells of the array comprising all but an insignificant proportion of the overall area of the array to be exposed to radiation.

The area of each contact 25, 27, 31 and 32 to a semiconductor device 20 is required to be as extensive as possible, to facilitate the transfer of current between the contact and the semiconductor body, commensurate with the contact not obscuring a significant portion of the P-N junction 22 from radiation incident on the upper surface 23 of the semiconductor device 20. Thus, in the solar cells formed in the semiconductor body in accordance with the present invention, the anode 27 of a solar cell 11 and the anode 31 of a protective diode 12 on a semiconductor device do not occupy a significant proportion of the upper surface 23 of the device to be exposed to radiation. The cathode 25 of a solar cell 11 and the cathode of a protective diode on a semiconductor device 20 extend over a substantial area of the lower surface 33 of the device, the lower surface 33 not being exposed to radiation. The anodes 27 and 31 on the lower surface 33 of the device have annular portions facilitating the transfer of current between the contact and the semiconductor body.

The manner in which the required interconnections are made according to the present invention between the three semiconductor devices 20 and the separate protective diode 12A of each linearly extending part of the array, comprising a column of the array 10, is shown in greater detail in FIG. 2. Each electrical connection is provided with tabs which are soldered to the contact 25, 27, 31 and 32 of the semiconductor devices. Each tab conforms substantially in size and shape to the contact of the devices to which it is soldered, and the tabs connected to the contact 25, 27, 31 and 32 are indicated in FIG. 2 by the reference numbers 25*a*, 27*a*, 31*a* and 32*a* respectively.

An electrical connection 34 is provided between the cathode 25 of a solar cell 11 and the anode 32 of a protective diode 12, whether the protective diode is formed in a semiconductor device 20 or comprises the separate protective diode 12A. As is shown in FIG. 2, each electrical connection 34 comprises a grid structure, with two substantially S-shaped thin metal strips connected together by a strip 36. An electrical connection 37 is provided between the anode 27 of a solar cell 11 and the cathode 31 of a protective diode 12, whether the protective diode is formed in a semiconductor device 20 or comprises the separate protective diode 12A. Each electrical connection 37 comprises a thin metal strip which is substantially Z-shaped.

At the end of the column having the separate protective diode 12A the lower tabs (not shown) of the S-shaped electrical connection 37 are connected to the −V rail and to the anode 31A of the separate protective diode. The upper tab (not shown) of the Z-shaped electrical connection 34 is connected to the cathode 32A of the separate protective diode 12.

At the other end of the column an additional S-shaped electrical connection 34A is provided, the lower tabs 31''*a* of this electrical connection are connected to the anode 31'' of the protective diode 12'', and hence is connected to the anode 27'' of the solar cell 11''. The upper tabs (not shown) of the electrical connection 34A are connected to the +V rail.

Each Z-shaped electrical connection 37 extends between the two constituent strips of the adjacent S-shaped electrical connection 34. Thus, each co-operating pair of electrical connections 34 and 37 are cross-connected between the opposing contact-bearing surfaces 23 and 33 of each adjacent pair of semiconductor devices 20.

In this manner, the electrical connections 34 and 37 of each column of the array 10 enable each semiconductor device 20 to be closely spaced to each other in end-to-end relationship, the separate protective diode 12A being conveniently located at one end of the column.

The array 10 is completed by connecting two or more columns, each identical to the illustrated column, between the −V and +V rails. Hence, the columns are connected in parallel and may be closely spaced in relation to each other. In each column the semiconductor devices extend substantially coaxially to each other. Throughout the array 10, the radiation-sensitive P-N junctions 22 of the solar cells 11 extend substantially parallel to the surface of the array 10 to be exposed to radiation.

Thus, the way in which the required interconnections are made between the solar cells 11 and the protective diodes 12 within the array, as described above, also ensures that the array has a flat, compact form, with the total of the radiation-sensitive areas of the solar cells of the array comprising all but an insignificant proportion of the overall area of the array to be exposed to radiation. The solar cells 11 have a high packing density within the array. The cross-connected S-shaped and Z-shaped electrical connections 34, 34A and 37 make the array flexible in form.

Each protective diode 12 may be shared by adjacent solar cells 11 in two or more columns of the array, the adjacent solar cells being in the same row of the array, only the appropriate number of columns of the array being formed in the manner described above, the other columns of the array being cross-connected to these columns in the required way.

Solar cells of each linearly extending part comprising a row of the array may be connected in series, instead of the solar cells of each column of the array as described above.

In each semiconductor device, it is not essential that the P-N junction of the solar cells is co-planar with the P-N junction of the protective diode. The slot separating the P-N junction of the protective diode from the P-N junction of the solar cell may be formed in any convenient way. Alternatively, in each semiconductor device the P-N junction of the solar cell may be electrically isolated from the P-N junction of the protective diode by means other than forming a slot partially through the semiconductor.

What I claim is:

1. A semiconductor device for an array of solar cells comprising in a semiconductor body a combination of a solar cell and a protective diode having a common region of one conductivity type and isolated regions of opposite conductivity type, said regions being of the P and N type, said solar cell being defined by a first radiation sensitive P-N junction within the semiconductor body, said protective diode being defined by a further P-N junction within said semiconductor body, means for isolating the radiation sensitive P-N junction of the solar cell from the P-N junction of the protective diode, said solar cell and said protective diode each include a contact on the surface of isolated regions of the semiconductor body and a contact on the common region of the semiconductor body, and said first radiation sensitive P-N junction being co-planar with the P-N junction of the protective diode.

2. A semiconductor device as claimed in claim 1 in which the protective diode is adjacent to the periphery of the semiconductor body.

3. A semiconductor device as claimed in claim 1 in which the radiation-sensitive P-N junction of the solar cell is parallel to the surface of the semiconductor body to be exposed to radiation.

4. A semiconductor device as claimed in claim 1 in which the P-N junction of the protective diode is separated from the P-N junction of the solar cell by a slot extending partially through the semiconductor body from said contact-bearing surface and electrically isolating a small portion of said region of opposite conductivity type from the bulk of said opposite conductivity type region.

5. An array of solar cells having at least one part including a plurality of semiconductor devices, each semiconductor device comprising a solar cell defined by a radiation sensitive P-N junction within the semiconductor body and aprotective diode defined by a further P-N junction within said semiconductor body, the radiation sensitive P-N junction and further P-N junction having a common region of one conductivity type, the radiation sensitive P-N junction of the solar cell being coplanar with and isolated from the P-N junction of the protective diode, each said solar cell and each said protective diode having a contact on opposing surfaces of the semiconductor body in each said part of the array the plurality of semiconductor devices being interconnected to form a corresponding plurality of solar cells in series, and each of the solar cells except one being connected individually in parallel with a protective diode in a different semiconductor device from the solar cell, the radiation sensitive P-N junction of a solar cell being arranged with reverse polarity of the P-N junction of a protective diode with which it is connected in parallel.

6. An array as claimed in claim 5 wherein said part of the array comprises a linearly extending arrangement of solar cells, the array comprising a plurality of said parts extending parallel to each other thereby defining a plurality of columns and rows, in each said part of the array the contacts of the semiconductor devices being interconnected to form a corresponding plurality of solar cells in series, and each of the solar cells except one being connected individually in parallel with a protective diode in a different semiconductor device from the solar cell, the radiation-sensitive P-N junction of a solar cell being arranged with reverse polarity to the P-N junction of a protective diode with which it is connected in parallel, said one solar cell being at one end.

7. An array as claimed in claim 5 in which each of said parts of the array is completed by an additional protective diode connected in parallel with said one solar cell, the radiation-sensitive P-N junction of said one solar cell being arranged with reverse polarity to the P-N junction of the additional protective diode.

8. An array as claimed in claim 5 in which at least one semiconductor device of each of said parts of the array is connected individually to each of two adjacent semiconductor devices by two connection members and each pair of connection members are cross-connected between opposing contact-bearing surfaces of each adjacent pair of semiconductor devices.

9. An array as claimed in claim 5 having the radiation-sensitive P-N junction of each solar cell in parallel with the surface of the semiconductor body to be exposed to radiation.

10. An array as claimed in claim 5 in which the semiconductor devices of each of said parts of the array extend substantially co-axially in relation to each other, and the P-N junction of each solar cell extends substantially parallel to the surface of the array to be exposed to radiation.

11. A semiconductor device for an array of solar cells comprising in a semiconductor body a combination of a solar cell and a protective diode, said solar cell being defined by a region of one conductivity type and a region of another conductivity type forming a radiation sensitive P-N junction within the semiconductor body, said protective diode being defined by a region of one conductivity type and a region of another conductivity type forming a further P-N junction within said semiconductor boby, said solar cell and said protective diode having a common region of said one conductivity type, means for isolating the radiation sensitive P-N junction of the solar cell from the P-N junction of the protective diode, said means including a slot extending partially through the semiconductor body from one surface of the body and intersecting the P-N junction to electrically isolate a small portion of said region of another conductivity type from the bulk of said region of another conductivity type, said radiation sensitive P-N junction and said further P-N junction being coplanar and said solar cell and said protective diode being provided with a contact on the surface of isolated conductivity regions of the semiconductor body and a contact on the common region of the semiconductor body.

12. A semiconductor device as set forth in claim 11 wherein said common region is a P-type region and, said P-type region being integral to both P-N junctions of the semiconductor body, said P-N junctions of the protective diode comprising a small N-type region electrically isolated from the bulk of the N-type region and separated therefrom by said slot extending around the small N-type region such that the total of the radiation-sensitive area of the solar cell includes all but an insignificant proportion of the overall area of the semiconductor device.

13. An array of solar cells having at least one part including a plurality of semiconductor devices, each semiconductor device comprising a solar cell defined by a region of one conductivity type and a region of another conductivity type forming a radition sensitive P-N junction within the semiconductor and a protective diode defined by a further P-N junction within said semiconductor body, said solar cell and said protective diode having a common region of said one conductivity type, the radiation-sensitive P-N junction of the solar cell being coplanar with the P-N junction of the protective diode, means for isolating the radiation-sensitive P-N junction of the solar cell from the P-N junction of the protective diode, said means including a slot extending partially through the semiconductor body from one surface of the body and intersecting the P-N junction, in each said part of the array the plurality of semiconductor devices being interconnected to form a corresponding plurality of solar cells in series, and each of the solar cells except one being connected individually in parallel with a protective diode in a different semiconductor device from the solar cell, the radiation sensitive P-N junction of a solar cell being arranged with reverse polarity to the P-N junction of a protective diode with which it is connected in parallel, each of said parts of the array including a separate and additional protective diode connected in parallel with said one solar cell, the radiation-sensitive P-N junction of said one solar cell being arranged with reverse polarity to the P-N junction of the additional protective diode and the two opposing surfaces of the semiconductor body of each semiconductor device including a contact for the solar cell and a contact for the protective diode, at least one semiconductor device of each of said parts of the array being connected individually to each of two adjacent semiconductor devices by two connection members and each pair of connection members being cross-connected between opposing contact-bearing surfaces of each adjacent pair of semiconductor devices.

* * * * *